(12) United States Patent
Yoshimoto

(10) Patent No.: US 7,626,650 B2
(45) Date of Patent: Dec. 1, 2009

(54) LIQUID CRYSTAL DISPLAY PANEL MANUFACTURING METHOD AND LIQUID CRYSTAL DISPLAY PANEL

(75) Inventor: Yoshikazu Yoshimoto, Sendai (JP)

(73) Assignee: Future Vision Inc., Tokyo (JP)

( * ) Notice: Subject to any disclaimer, the term of this patent is extended or adjusted under 35 U.S.C. 154(b) by 132 days.

(21) Appl. No.: 11/859,022

(22) Filed: Sep. 21, 2007

(65) Prior Publication Data

US 2008/0074573 A1 Mar. 27, 2008

(30) Foreign Application Priority Data

Sep. 21, 2006 (JP) .............................. 2006-255321
May 7, 2007 (JP) .............................. 2007-122731

(51) Int. Cl.
*G02F 1/136* (2006.01)
(52) U.S. Cl. .............................. 349/46; 438/30; 438/617
(58) Field of Classification Search .................. 438/30, 438/617; 349/46
See application file for complete search history.

(56) References Cited

U.S. PATENT DOCUMENTS 7,294,566 B2 * 11/2007 Moriya et al. ................ 438/617

FOREIGN PATENT DOCUMENTS

| JP | 2000-249821 | 9/2000 |
|---|---|---|
| JP | 2002-520840 | 7/2002 |
| JP | 2003-318193 | 11/2003 |
| JP | 2008102485 | * 5/2008 |

* cited by examiner

*Primary Examiner*—Frank G Font
*Assistant Examiner*—Eric Wong
(74) *Attorney, Agent, or Firm*—Antonelli, Terry, Stout & Kraus, LLP.

(57) ABSTRACT

The present invention provides a technique, by which it is possible to obtain a liquid crystal display panel with high precision by forming very fine pattern of electroconductive film through linking of the areas with different widths, and it is also possible to reduce the number of processes. Like a wide-width electroconductive film and a narrow-width electroconductive film, most of the surface of an underlying film UW of a thin-film transistor substrate SUB1 is turned to lyophobic portion RA, and only the narrow-width gate electrode forming area is turned to lyophilic portion FA. An electroconductive ink is dropped evenly to the gate electrode forming area of the lyophilic portion FA, and a wide-width gate line is formed on the gate line forming area GLA of lyophobic portion RA by direct drawing of IJ. The film thickness of the ink films on the gate electrode forming area GTA and the gate line forming area GLA are controlled by adjusting a dropping amount of the ink on each area, and film thicknesses of these areas obtained on the liquid crystal display panel after baking are adjusted to be equal with each other.

15 Claims, 11 Drawing Sheets

$T_{GT} < T_{GL}$

LIQUID CRYSTAL DISPLAY PANEL MANUFACTURING METHOD AND LIQUID CRYSTAL DISPLAY PANEL

FIELD OF THE INVENTION

The present invention relates to a semiconductor system such as liquid crystal display system. In particular, the invention relates to a method for manufacturing an active matrix type liquid display panel and a liquid crystal display panel manufactured by this method.

BACKGROUND OF THE INVENTION

A liquid crystal display system of this type comprises a liquid crystal display panel, a driving circuit, and peripheral devices such as backlight. FIG. 13 represents schematical cross-sectional views to explain an approximate arrangement example of a typical longitudinal electric field type (the so-called TN type) liquid crystal display system. Normally, in a liquid crystal display panel, which constitutes an active matrix type liquid crystal display system, a liquid crystal LC is sealed between a first panel PNL1, which is composed of a first substrate (an active matrix substrate or a thin-film transistor substrate; TFT substrate) and a second panel PNL2, which is composed of a second substrate (a counter substrate or a color filter substrate; CF substrate).

On an inner surface of a first substrate SUB1, which constitutes a first panel PNL1, there are provided a thin-film transistor TFT and a pixel electrode PX driven by the thin-film transistor TFT. On the uppermost layer, a first orientation film ORI1 is deposited, and an ability to control liquid crystal orientation is provided. Also, on an outer surface (back surface), a first polarizing plate POL1 is attached. On the other hand, on an inner surface of a second substrate to constitute a second panel PNL2, there are provided a color filter CF, a light-shielding layer (black matrix) BM to partition off between color filters of adjacent pixels, and a counter electrode CT. On the uppermost layer, a second orientation film ORI2 is deposited, and an ability to control liquid crystal orientation is provided. Also, on an outer surface (front surface), a second polarizing plate POL2 is attached, which has a polarizing axis perpendicularly crossing the polarizing axis of the first polarizing plate POL1. In the figures, detailed arrangement is not shown.

In the manufacturing process to fabricate the thin-film transistor TFT on the first substrate SUB1, a plurality of gate lines and gate electrodes extending from the gate lines made of metal film such as chromium, are arranged for each pixel in parallel to each other. In general, the width of the gate electrode is narrower than the width of the gate line. Then, an insulating layer, an active layer, (silicon semiconductor layer), data lines, data electrodes (source and drain electrodes), pixel electrodes, protective films, orientation films, etc. are formed. By giving an ability to control liquid crystal orientation to the orientation film, the first substrate is prepared. On a back surface of the first substrate SUB1, a backlight BLK is mounted. The circuit to drive this liquid crystal display panel is not shown in the figure.

FIG. 14 represents schematical drawings to explain an arrangement of one pixel of the liquid crystal display panel explained in connection with FIG. 12 and an arrangement of a thin-film transistor to constitute this pixel. Specifically, FIG. 14 (a) is a plan view of the pixel, and FIG. 14 (b) is a cross-sectional view along the line A-A' in FIG. 14 (a). As shown in FIG. 14 (a), the thin-film transistor TFT is disposed at an intersection of the gate line GL and the data line DL. Also, a pixel electrode PX to constitute a pixel is connected to a source electrode (or a drain electrode) SD1 of the thin-film transistor TFT via a contact hole TH, and an auxiliary capacity is formed between an auxiliary capacity line CL and the pixel electrode.

In FIG. 14 (b), a gate electrode GT extending from the gate line GL and a gate insulator film GI to cover the gate electrode GT are formed on an underlying film UW prepared on the surface of the first substrate SUB1 in the thin-film transistor TFT. On this gate insulator film GI, a silicon (Si) semiconductor layer SI as an active layer and an ohmic contact layer ($n^+Si$) NS, a source electrode SD1 and a drain electrode SD2 are laminated sequentially. The underlying film UW is made of a laminated film comprising silicon nitride and silicon oxide.

To cover the gate line GL and the gate electrode GT, a gate insulator film GI preferably made of silicon nitride ($SiN_x$) is deposited, and a plurality of data lines DLs to cross the gate lines GLs are formed. At the same time as the formation of the data lines DLs, a source electrode (or a drain electrode) SD1 and a drain electrode (or a source electrode) SD2 are prepared in the same layer.

In case of full-color display, the pixel is a sub-pixel of each single color (red, green, or blue). Here, it is simply called "pixel". As described above, the thin-film transistor TFT to constitute the pixel comprises a gate electrode GT, a silicon semiconductor film SI prepared by patterning on the gate electrode, an ohmic contact layer ($n^+$ silicon) NS separately formed on upper layer of the silicon semiconductor film, and a source electrode (or a drain electrode) and a drain electrode (or a source electrode) connected respectively to the separated ohmic contact layers.

On upper layer of the thin-film transistor, a protective film PAS is deposited. On it, a pixel electrode PX preferably made of ITO is prepared by patterning and is connected to the source electrode (or the drain electrode) SD1 via a contact hole TH formed on the protective film PAS. A first orientation film (see FIG. 13) is prepared to cover the pixel electrode PX.

On the other hand, on another substrate not shown in the figure, a counter electrode is formed via color filters for three colors in case of full-color and a smooth layer (overcoating layer) (not shown in FIG. 13). A second orientation film (see FIG. 13) is deposited to cover the counter electrode, and this is superimposed on the active matrix substrate, which is another substrate as described above, and a liquid crystal is sealed in a gap between them.

The preparation of lines or the like of the active matrix type substrate by using the ink jet method as described above is disclosed in the Patent Document 1. In the Patent Document 1, it is described that the gate electrode of the thin-film transistor TFT is prepared by ink jet method using a liquid material containing an electroconductive material, and the source electrode and the drain electrode of the thin-film transistor TFT are prepared by the ink jet method using a liquid material containing a semiconductor material. The Patent Document 3 is an example of references to disclose mask-less exposure to light as described later.

[Patent Document 1] JP-A-2003-318193
[Patent Document 2] JP-A-2000-249821
[Patent Document 3] JP-A-2002-520840

SUMMARY OF THE INVENTION

According to the method known in the past, gate lines and gate electrodes, source and drain electrodes, etc. of thin-film transistor in the manufacture of liquid crystal display panel are prepared through combination of metal film sputtering and photolithographic process. By adopting a new method for direct drawing of electroconductive ink (hereinafter also referred as "IJ direct drawing") based on ink jet method (IJ method), it would be possible to reduce the investment amount on facilities and the manufacturing cost and to extensively improve production efficiency. Also, with the progress in the technique to produce the display with high precision, it is necessary to prepare a thin-film transistor with very fine structure. However, when metal lines are prepared by IJ direct drawing, it is difficult at present to prepare very fine line pattern with width of 30 µm or less. In particular, in case of a thin-film transistor of high precision, the gate electrode must be prepared with a width of 10 µm or less. For the preparation of the gate electrode with such narrow width, IJ direct drawing method cannot be used.

Also, it is now becoming more and more difficult to apply the IJ direct drawing method—not only in the preparation of gate electrode of the thin-film transistor in the manufacture of the liquid crystal display panel but also in the production of lines and electrodes with narrow width in various types of semiconductor apparatuses, for which it is necessary to prepare other lines and electrodes or structure layer patterns, silicon substrates, etc.

Under such circumstances, special notice is now given on the so-called lyophobic-lyophilic contrast pattern method instead of the IJ direct drawing method in the preparation of lines and electrodes with narrow width produced by using ink jet method, typically in the preparation of gate lines and gate electrodes of thin-film transistor. This lyophobic-lyophilic contrast pattern method is to prepare gate line forming area and gate electrode forming area on the substrate in lyophilic pattern, and other areas are left in lyophobic state, and an electroconductive ink is dropped and poured by IJ method to the gate line forming area and the gate electrode forming area, which are in lyophilic state. Also, a method is known, according to which lyophilic gate line forming area and lyophilic gate electrode forming area are prepared by using bank, and ink is dropped and poured by the IJ method (the Patent Document 2).

However, in the lyophobic-lyophilic contrast pattern method, when widths are different in the lyophilic patterns, the electroconductive ink may not be poured to some part at the forward end of the pattern with narrow width, or film thickness of the pattern with narrow width may be decreased. In the method using bank, it is necessary to adopt a photolithographic process for the preparation of bank and a process for the preparation of lyophobic-lyophilic pattern, and it is difficult to reduce the number of processes.

It is an object of the present invention to provide a method for manufacturing liquid crystal display panel and also to provide a liquid crystal display panel manufactured by this method, according to which it is possible to prepare very fine lines and very fine electrodes with different pattern widths of lines and electrodes by reducing the number of processes.

To attain the above object, the present invention provides a method for manufacturing liquid crystal display panel, which comprises a method for manufacturing a liquid crystal display panel, comprising a liquid crystal between a first substrate and a second substrate, and pixels with thin-film transistor arranged in form of matrix on said first insulation substrate, said method comprises:

a process for performing lyophobic-lyophilic processing by turning most of the surface of said first substrate where said thin-film transistor is formed to lyophobic property including a portion where electroconductive film with wide width is formed by direct drawing of electroconductive ink and by turning the surface to lyophilic property including a portion to form an electroconductive film with narrow width where the electroconductive ink cannot be applied by direct drawing;

a process for forming an ink film on the electroconductive portion with narrow width for obtaining an ink film to prepare the electroconductive film with narrow width with a film thickness as required by dropping an electroconductive ink to a portion where said electroconductive film with narrow width is formed, and by pouring the electroconductive ink of lyophilic property to a portion where the electroconductive film with narrow width is formed;

a process for forming an ink film on an electroconductive portion with wide width to obtain an ink film for forming an electroconductive film of wide width with film thickness as required by dropping an electroconductive ink to a portion where the electroconductive film of wide width is formed by direct drawing; and a process for baking an ink film to prepare the electroconductive film with narrow width and the electroconductive film with wide width by baking of said electroconductive ink film with narrow width and said electroconductive ink film with wide width;

wherein said processes are carried out in the order described herein.

Also, according to the manufacturing method of the present invention, the order of a process for forming ink film on the narrow-width electroconductive portion and a process for forming ink film on the wide-width electroconductive portion can be changed.

In case the process for forming ink film on the wide-width electroconductive portion by direct drawing of the electroconductive ink is performed before the process for forming ink film on the narrow-width electroconductive portion, the purpose of the method can be accomplished by superimposing a part of the electroconductive ink on a part of the ink film on the narrow-width electroconductive portion. Also, in case the process for forming ink film on the wide-width electroconductive portion is performed after the process for forming ink film on the narrow-width electroconductive portion, a part of the electroconductive ink is superimposed on a part of the ink film on the wide-width electroconductive portion so that the narrow-width electroconductive film and the wide-width electroconductive film obtained in the process for baking the ink film can be turned to an integrated electroconductive film.

Further, the manufacturing method according to the present invention is characterized in that, in the process for forming ink film on the wide-width electroconductive portion or in the process for forming ink film on the narrow-width electroconductive portion, the film thicknesses of the wide-width electroconductive film and the narrow-width electroconductive film obtained in the ink film baking process can be made equal to each other by controlling a coating amount or a dropping amount of the electroconductive ink.

Also, in the liquid crystal display panel of the present invention, said gate line is prepared through patterning by using direct drawing of electroconductive ink on a lyophobic area provided on inner surface of said first substrate;

said gate electrode is prepared through patterning by dropping an electroconductive ink to a lyophilic portion provided on a tablet-like pattern extending to the region of said active layer by linking one end thereof with said gate line on inner surface of said first substrate; and electrode width of said gate electrode is different from line width of said gate line, and film thickness of said gate electrode is approximately equal to film thickness of said gate line.

According to the present invention, it is possible to prepare very fine lines or very fine electrodes with different pattern widths of lines and electrodes by reducing the number of processes. By applying the method to the manufacture of liquid crystal display panel, it is possible to manufacture a liquid crystal display panel with high precision display ability through the manufacture of gate electrodes with narrow width extending from the gate lines of the thin-film transistor by reducing the number of processes.

BRIEF DESCRIPTION OF THE DRAWINGS

FIG. 10 is a schematical drawing to explain Embodiment 4 of the method for manufacturing the liquid crystal display panel according to the present invention;

FIG. 11 is a drawing similar to FIG. 10 to explain Embodiment 4 of the method for manufacturing the liquid crystal display panel of the present invention;

DESCRIPTION OF THE PREFERRED EMBODIMENTS

Description will be given below on the best aspects of the invention. In the following, description will be given on embodiments, in which the present invention is applied on a thin-film transistor of a liquid crystal display panel. First, the background of the invention will be described by referring to the verification of coating property of an ink using a combination of lyophobic-lyophilic contrast pattern and ink jet method.

Figure 1:
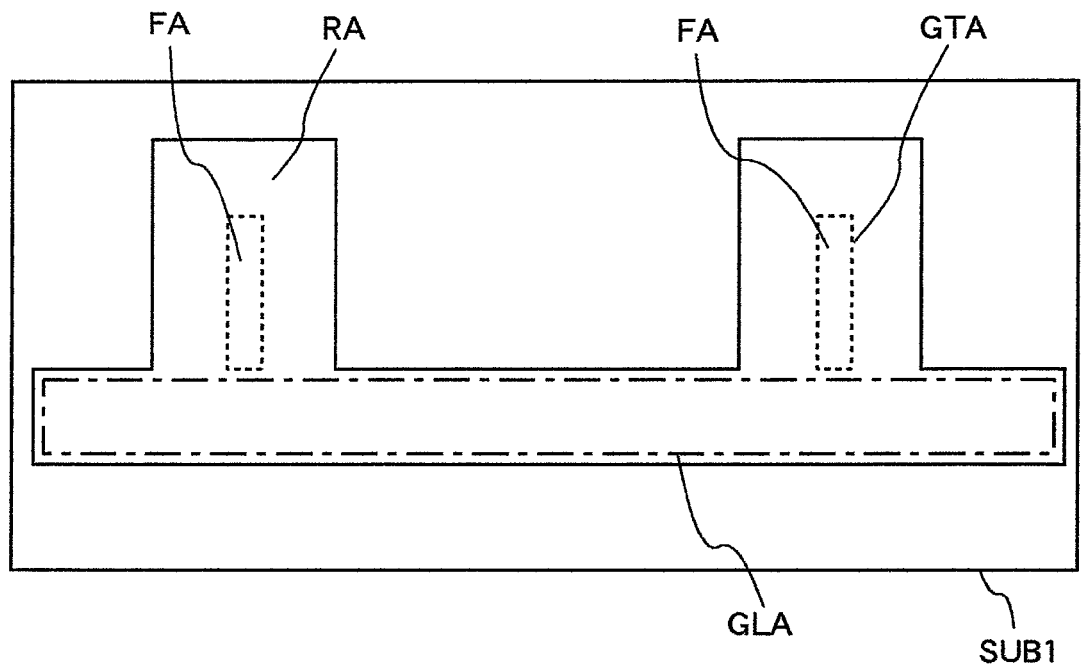
Figure 1:
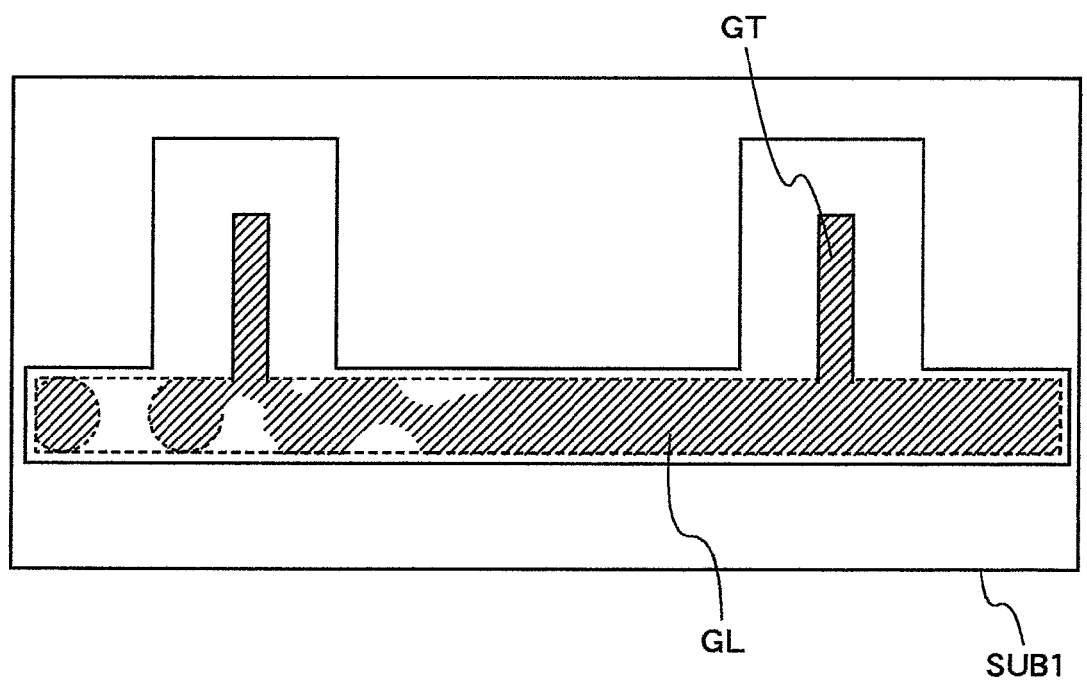

FIG. 1 represents schematical drawings to explain the preparation of a gate line and a gate electrode using lyophobic-lyophilic contrast pattern and ink jet method. A first substrate SUB1 is a thin-film transistor substrate made of glass plate, which makes up a liquid crystal display panel. On inner surface of the first substrate SUB1, an underlying film UW (or an underlying layer) is deposited to prevent the diffusion of ions from glass and to smoothen the surface. Normally, the underlying film UW comprises silicon nitride and silicon oxide.

As shown in FIG. 1 (a), most of the surfaces of the underlying film UW consists of lyophobic area RA, and a gate line forming area GLA and a gate electrode forming area GTA are designed as lyophilic areas FA. A wiring width Wgt of the gate electrode forming area GTA is narrower than a wiring width Wgl of the gate line forming area GLA (Wgt<Wgl)). On this lyophilic area FA, an electroconductive ink F-IK is dropped via an ink jet nozzle NZ for coating (FIG. 1 (b)). After baking process, a gate line/gate electrode pattern is prepared, which is formed by the gate line GL and the gate electrode GT extending from the gate line GL.

Figure 1A:
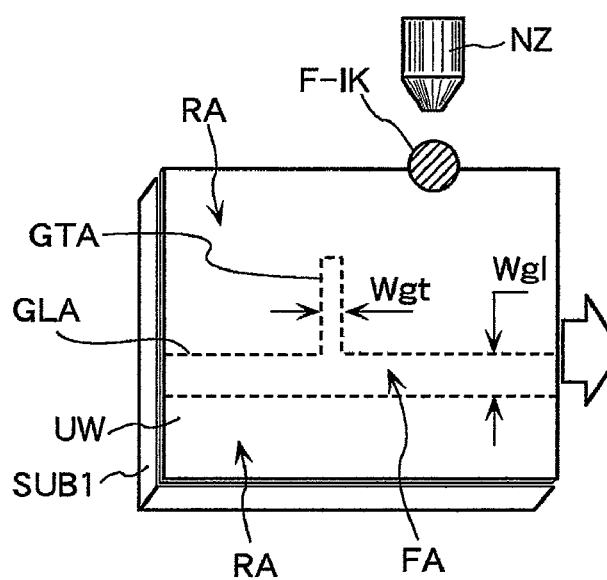
FIG. 1 represents schematical drawings to explain the formation of a gate line and a gate electrode using lyophobic-lyophilic contrast pattern and ink jet.
Figure 1B:
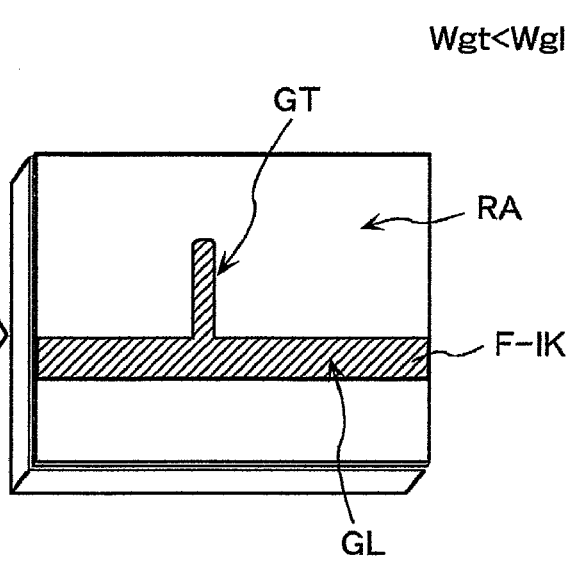
Figure 2:
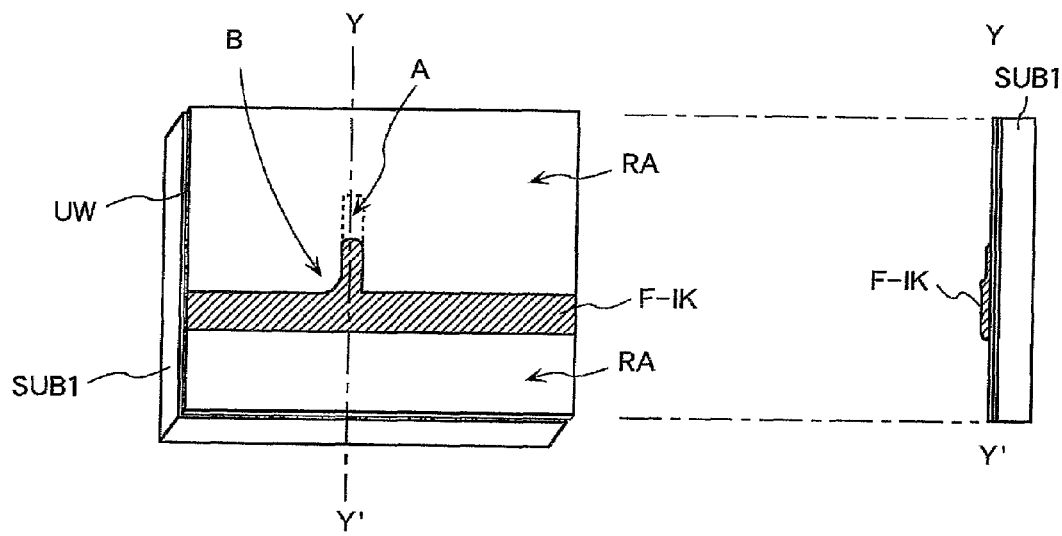
FIG. 2 represents schematical drawings to explain problems in the preparation of circuit pattern using lyophobic-lyophilic contrast pattern and ink jet.
Figure 2:
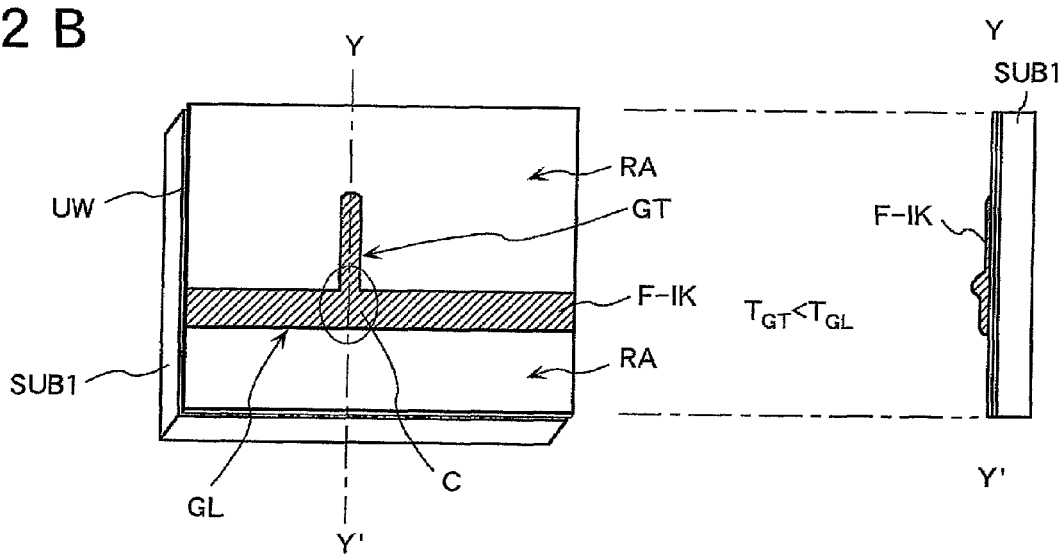

FIG. 2 represents schematical drawings to explain problems in the preparation of circuit pattern by using lyophobic-lyophilic contrast pattern and ink jet method. The left portion of each of FIG. 2 (a) and FIG. 2 (b) represents a plan view, and the right portion represents a cross-sectional view along the line Y-Y'. Filling amount of the liquid to an area with lyophilic property is generally determined by a contact angle when the liquid comes into contact in the lyophobic area. For this reason, film thickness will be thinner at the portions with narrower width (portion with finer line; portion with narrower width). As shown in FIG. 2 (a), the liquid does not flow to a forward end of the gate electrode GT, which is shown by an arrow A. Also, at the corner of the connecting part with the gate line GL shown by an arrow B with wider area, the liquid is pulled and guided to the gate line area with wider width, and this causes overflow of the liquid due to the rising of the liquid.

As shown in FIG. 2 (b), when the liquid is poured to the entire region of the lyophobic-lyophilic contrast pattern, the film on the gate electrode GT is thin. At the connection of the gate line GL and the gate electrode GT, the film thickness is thicker than the film thickness on the gate line GL.

Figure 3:
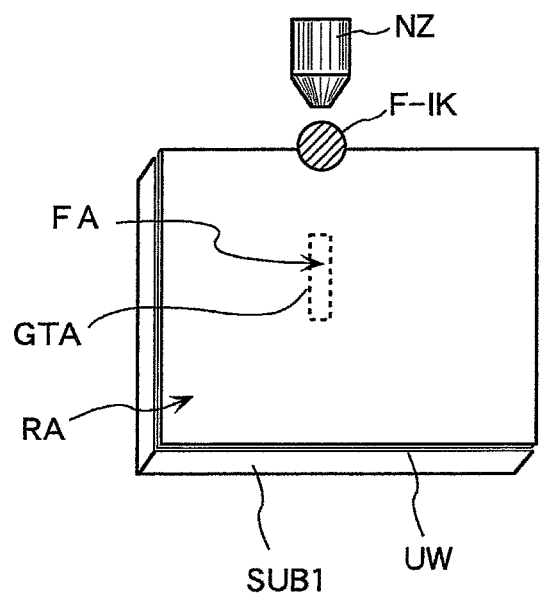
FIG. 3 represents drawings to explain liquid pouring condition when a gate electrode forming area in the preparation of circuit pattern using lyophobic-lyophilic contrast pattern and ink jet is designed to have unique lyophilic property.
Figure 3:
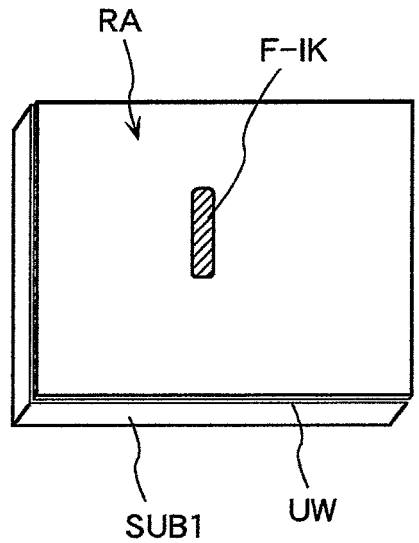

FIG. 3 represents drawings to explain liquid pouring condition when the gate electrode forming area in the preparation of circuit pattern by using lyophobic-lyophilic contrast pattern and ink jet is designed to have unique lyophilic property. In this case, as shown in FIG. 3 (a), the lyophilic property is given only to the gate electrode forming area GTA of the underlying film UW of the thin-film transistor substrate SUB1 where the entire region has been turned to lyophobic area RA. When an adequate quantity of electroconductive ink F-IK is dropped to the gate electrode forming area GTA, which has been turned to have lyophilic property via an ink jet nozzle NZ, the electroconductive ink F-IK is perfectly poured to the entire region of the gate electrode forming area GTA even when the width is narrower as shown in FIG. 3(b).

Figure 4:
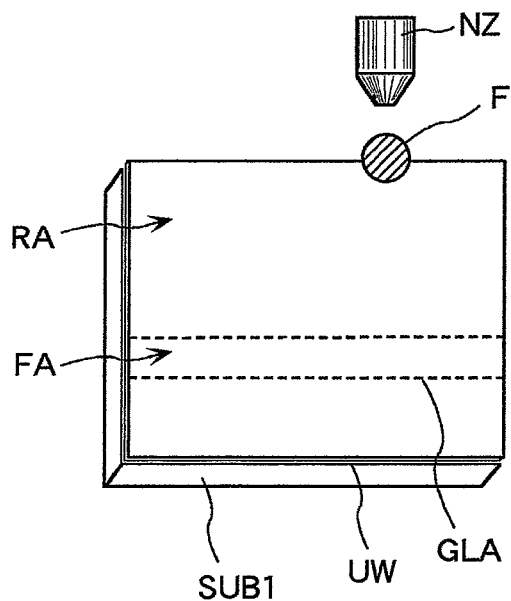
FIG. 4 represents schematical drawings to explain liquid pouring condition when a gate line forming area in the preparation of circuit pattern using lyophobic-lyophilic contrast pattern and ink jet is designed to have unique lyophilic property.
Figure 4:
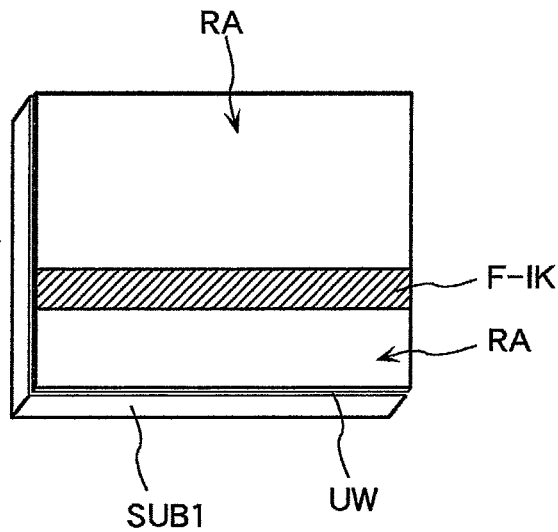

FIG. 4 represents schematical drawings to explain the liquid pouring condition when the gate line forming area is designed to have unique lyophilic property in the formation of circuit pattern using lyophobic-lyophilic contrast pattern and ink jet. As shown in FIG. 4 (a), lyophilic property is given only to the gate line forming area GLA of the underlying film UW of the thin-film transistor substrate SUB1 where the entire region has been turned to lyophobic area RA. When an adequate quantity of electroconductive ink F-IK is dropped via an ink jet nozzle NZ to the gate line forming area GLA, which has been turned to lyophilic, the ink is poured to the entire region of the gate line forming area GLA as shown in FIG. 4 (b).

Figure 5:
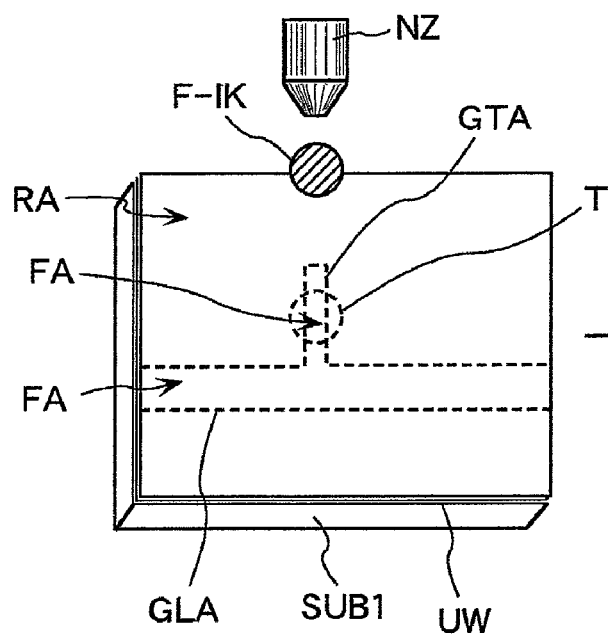
FIG. 5 represents drawings to explain liquid pouring condition when the gate line forming area and the gate electrode forming area in the preparation of circuit pattern using lyophobic-lyophilic contrast pattern and ink jet are connected with each other, and the gate line and the gate electrode are designed to have lyophilic property.
Figure 5:
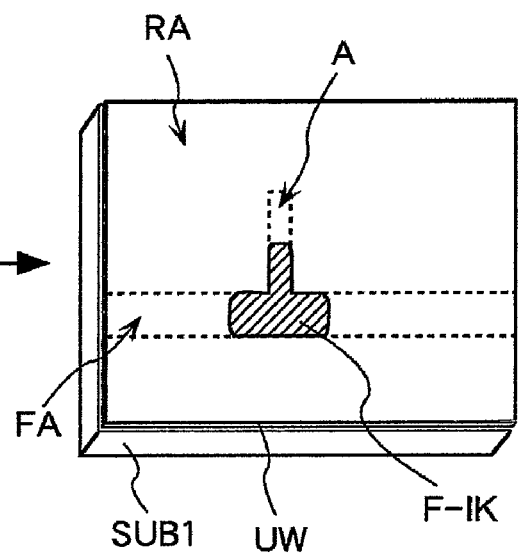

FIG. 5 represents schematical drawings to explain the liquid pouring condition in case the gate line and the gate electrode are turned to lyophilic by linking the gate line forming area with the gate electrode forming area in the preparation of the circuit pattern using lyophobic-lyophilic contrast pattern and ink jet. As shown in FIG. 5 (a), the lyophilic FA is given to the gate line forming area GLA and the gate electrode forming area GTA of the underlying film UV of the thin-film transistor substrate SUB1 where the entire region has been turned to lyophobic area RA. The relation between widths of these two areas is: Wgt<Wgl.

Only to the gate electrode forming area GTA, which has been turned to lyophilic, the electroconductive ink F-IK is dropped via an ink jet nozzle NZ. The position where the electroconductive ink F-IK is dropped is shown by a dotted circle TP. As a result, most of the electroconductive ink is poured to the gate line forming area GLA with wider width. As shown by an arrow A in FIG. 5 (b), the ink is not coated on a portion of the gate electrode forming area GTA with narrower width. Also, when the electroconductive ink F-IK is dropped to the gate electrode forming area GTA and it is then dropped to the gate line forming area GLA, uneven coating and the change in film thickness are observed as explained in connection with FIG. 2.

As verified in the above, in a limited area with the same line width, the pouring of the liquid (ink) contributes to attain stabilization as anticipated. However, on a pattern where line widths are different or on a portion where areas per unit length are different as in the case of the gate line and the gate electrode connected thereto, there may be a tendency that the stabilization can be attained by extensively decreasing the surface energy and free energy on the surface as the liquid is integrated at a portion where wider lyophilic area can be obtained.

Next, on the behavior of the added liquid drops, the following principles may be considered: (a) With the increase of surface energy, when the liquid spreads in the direction of lyophilic area including the gate electrode area, more stabilization can be reached in terms of energy as the surface energy is decreased. (b) More stabilization can be attained when free energy on the surface is decreased by reducing only the surface area and the liquid remains near the present boundary surface than the case where surface energy is decreased in association with the progress of liquid flow to the lyophilic area.

To give lyophobic property to the surface of the substrate, the lyophobic property of silicon nitride itself is utilized when the surface is made of silicon nitride. When the surface of the substrate is made of organic resin, a functional group containing fluorine or a silicon-containing additive is given to the resin. Or, after the resin is coated, plasma processing is performed by using fluorine gas, typically represented by carbon tetrafluoride. To the surface, which has been turned to lyophobic in this way, light is projected or electron beam is projected, and the processing to turn to lyophilic property is performed with the width and the pattern as desired. This processing is called "lyophobic-lyophilic processing".

To reliably prepare a pattern where a portion with wider width is in contact with a portion with narrower width, e.g. a pattern of gate line and gate electrode as desired as shown in FIG. 1 (b), the contribution of driving force as described in (a) above is higher. To this, higher lyophobic-lyophilic contrast and dynamic factors such as viscous resistance of the liquid are also involved. In the present status, lyophobic-lyophilic contrast reaches the level of limitation. Also, viscous resistance is at a level not to be lowered any more from the viewpoint of metal content. Under such limited conditions, if an action as given in (b) above is applied, the phenomenon as explained in connection with FIG. 3 may be very likely to occur.

Embodiment 1

Figure 6:
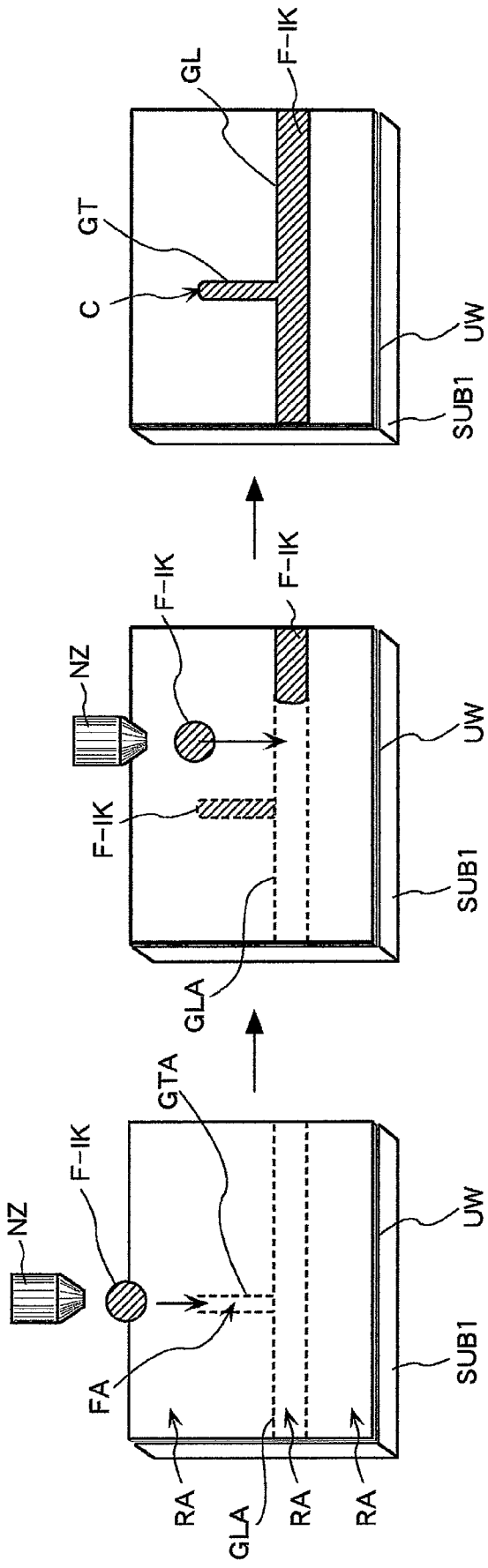
FIG. 6 represents drawings to explain Embodiment 1 of a method for manufacturing the liquid crystal display panel according to the present invention.

FIG. 6 represents schematical drawings, each to explain Embodiment 1 of liquid crystal display panel manufacturing method of the present invention. In Embodiment 1, as shown in FIG. 6 (a), most of the surface of the underlying film UW of the thin-film transistor substrate SUB1 is turned to lyophobic area RA, and only the gate electrode forming area GTA is turned to lyophilic area FA. (The gate line forming area GLA is also turned to lyophobic area RA.) This lyophobic-lyophilic processing is performed by the procedure as given above. Here, lyophilic property is given through optical scanning by using digital micro-mirror device (DMD) as to be described later. By using the optical scanning, a lyophilic pattern with narrow width can be formed, which cannot be attained by direct drawing of ink jet.

An electroconductive ink (e.g. a metal ink F-IK mixed with silver particles in solvent) is dropped to the gate electrode forming area GTA of lyophilic FA. After the dropped ink has spread evenly on the gate electrode forming area GTA, the gate line is formed by direct drawing of IJ to the gate line forming area GLA of the lyophobic RA (FIG. 6 (b)). In this case, if it is seen from microscopic viewpoint, a part of an end of the ink on the gate line area where ink jet is directly dropped is superimposed on upper layer of a part of an end of the gate electrode forming area GTA. The film thickness of each of the ink films on the gate electrode forming area GTA and the gate line forming area GLA can be controlled by adjusting a dropping amount of the ink at each portion. As a result, the film thickness of the two ink films to be obtained on the liquid crystal display panel after the baking can be adjusted to the same level.

According to Embodiment 1, it is possible to obtain the gate line and gate electrode pattern as desired, which corresponds to the dropping amount of the ink at each site of the gate electrode forming area GTA and the gate line forming area GLA (FIG. 6 (c)). Therefore, the gate line GL and the gate electrode GT are electrically integrated. The photolithographic process as practiced in the past is also not needed, and a liquid crystal display panel of very fine quality can be produced at low cost.

Embodiment 2

Figure 7:
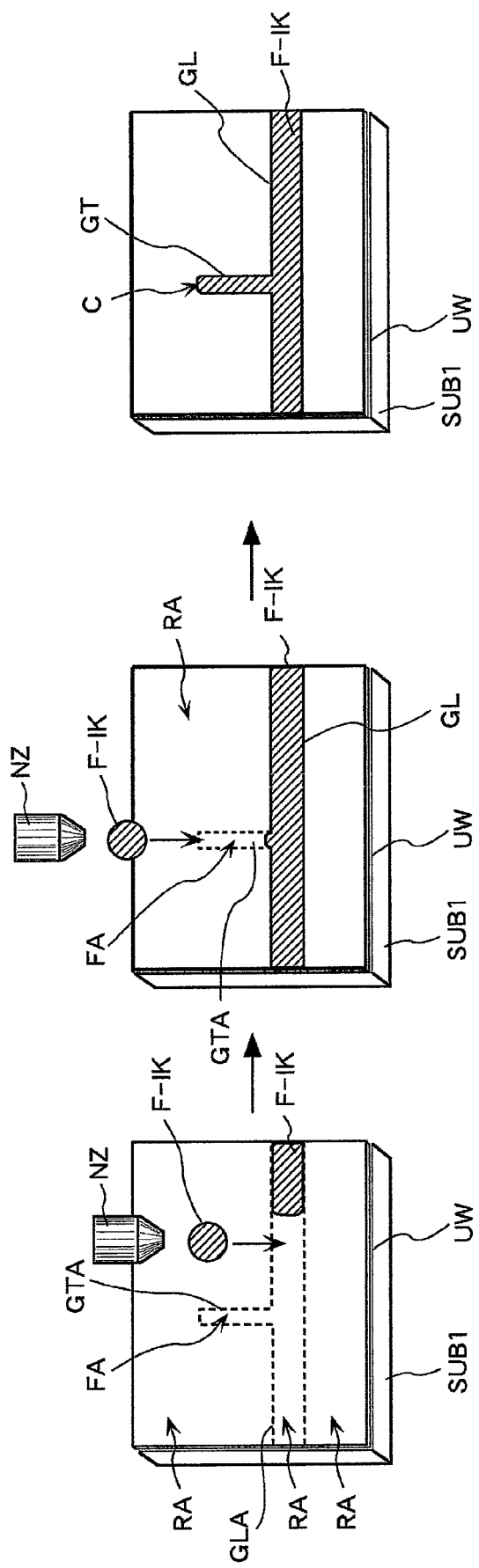
FIG. 7 represents drawings to explain Embodiment 2 of a method for manufacturing the liquid crystal display panel according to the present invention.

FIG. 7 represents schematical drawings, each to explain Embodiment 2 of the liquid crystal display panel according to the present invention. In Embodiment 2, as shown in FIG. 7 (a), most of the surface of the underlying film UW of the thin-film transistor substrate SUB1 is turned to lyophobic RA, and only the gate electrode forming area GTA is turned to lyophilic FA. (The gate line forming area GLA is also lyophobic RA). The lyophobic-lyophilic processing to be performed is similar to that of the Embodiment 1. First, the gate line is formed by direct drawing of IJ on the gate line forming area GLA with lyophobic property RA. Then, an electroconductive ink similar to the one used in Embodiment 1 is dropped on the gate electrode forming area GTA of lyophilic property FA. The dropped ink film is coated evenly on the gate electrode forming area GTA (FIG. 7 (b)).

In this case, if it is seen from microscopic viewpoint, a part of the ink coated by the dropping of IJ is superimposed on a part at the end of the ink on the gate line portion where IJ has been dropped by direct drawing. In the case of Embodiment 2, too, film thickness of ink film on the gate electrode forming area GTA and the gate line forming area GLA can be controlled by adjusting the dropping amount of the ink on each portion, and the film thickness on both areas can be adjusted to the same level after the baking. As a result, it is possible to reliably obtain the gate line and gate electrode pattern as desired, which corresponds to the dropping amount of the ink at each portion on the gate electrode forming area GTA and the gate line forming area GLA (FIG. 7 (c)).

In Embodiment 1 and Embodiment 2 of the present invention as described above, when the ink on the lyophobic portion (gate line forming area) with large area of wider pattern width is integrated with the ink on the lyophilic portion with smaller area of narrower pattern width (gate electrode forming area), it may be disadvantageous from the viewpoint of energy to pull and move the ink on the gate electrode side of lyophobic portion to the field of surface energy because there is high surface energy already on the lyophobic portion of the gate line area. Therefore, by this pattern forming method, the inks are not moved to opposite side even when the inks are integrated with each other.

To give lyophilic property in the present invention as explained in Embodiment 1 and Embodiment 2, a method is generally is used. According to this method, light is projected on the underlying layer, which has been turned to totally lyophobic by using light exposure mask with opening pattern. (This corresponds to the gate electrode forming area.) However, such type of light exposure mask is expensive. In this connection, a mask-less light exposure to give lyophilic property by using digital micro-mirror device (DMD) to the substrate coated with optical catalyst is disclosed in the Patent Document 3.

However, longer time is required when the entire area of the gate line and the gate electrode, which are used in a large-size liquid crystal display panel in television set, is turned to lyophilic property through the scanning by using DMD, and it is not yet used in practical application. In contrast, according to the present invention, the area to be turned to lyophilic property on the substrate is limited only to the gate electrode forming area, and the area to be exposed to light is extremely narrow.

Embodiment 3

Figure 8:
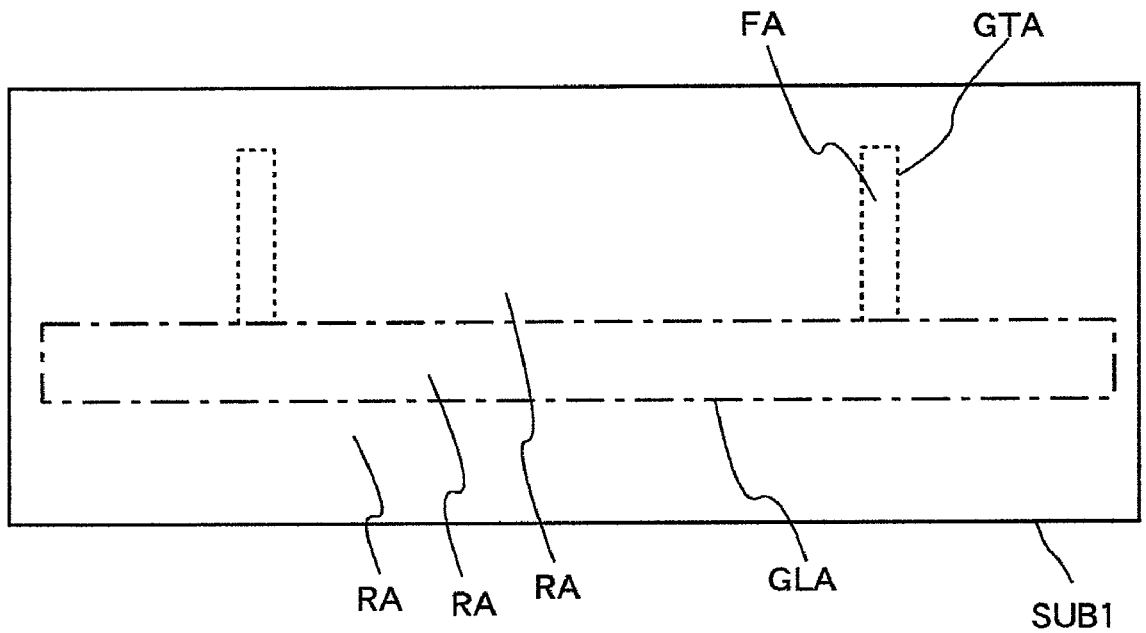
FIG. 8 is a drawing to explain Embodiment 3 of a method for manufacturing the liquid crystal display panel according to the present invention.
Figure 9:
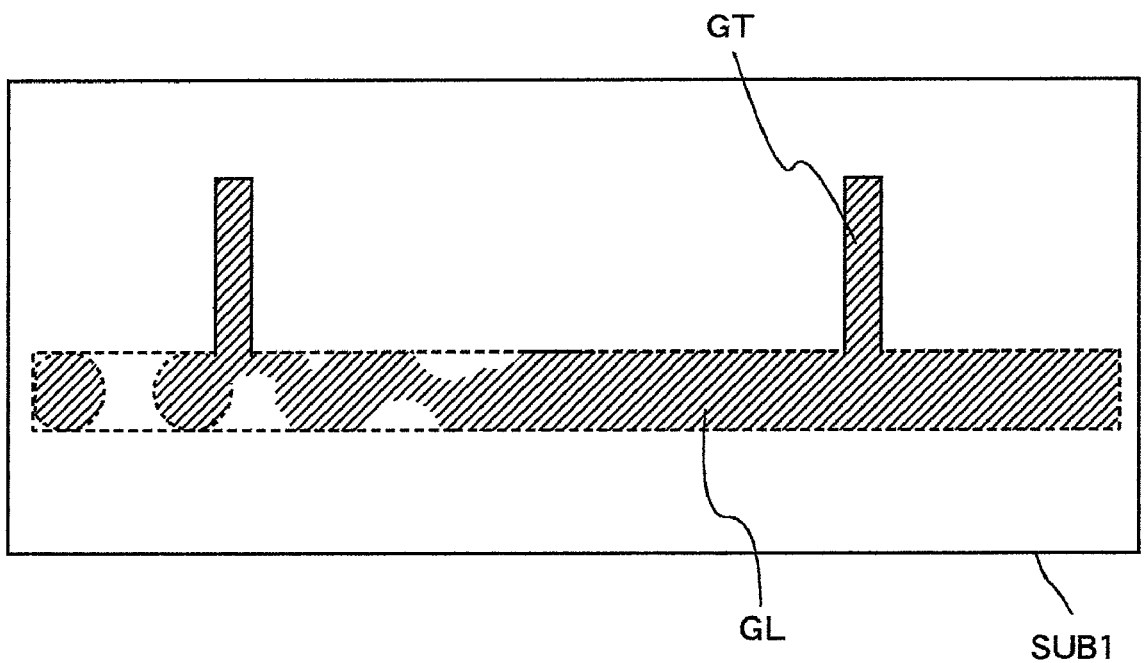
FIG. 9 is a drawing similar to FIG. 8 to explain Embodiment 3 of the method for manufacturing the liquid crystal display panel according to the present invention.

FIG. 8 and FIG. 9 each represents a schematical drawing to explain Embodiment 3 of the liquid crystal display panel manufacturing method according to the present invention. In Embodiment 3, as shown in FIG. 8, lyophilic area FA is applied on the gate electrode forming area GTA through optical scanning by using digital micro-mirror device (DMD) on the thin-film transistor substrate SUB1 where optical catalyst is coated on the entire surface. GLA represents a gate line forming area. All areas including this gate line forming area GLA except the gate electrode forming area GTA is maintained as lyophobic RA.

Then, as shown in FIG. 9, an electroconductive ink is dropped on the gate electrode forming area GTA by IJ. The electroconductive ink of the gate electrode GT is poured to the lyophilic area FA. Next, the electroconductive ink is coated by direct drawing of IJ to the gate line forming area GLA. After the baking, the gate electrode GT and the gate line GL are prepared. FIG. 9 shows a process where the ink film of the gate line GL is poured by direct drawing from the right to the left in the figure. By the preparation process in this procedure, a part of the gate line GL is superimposed on a part of the gate electrode GT. It may be so arranged that the electroconductive ink is coated by direct drawing of IJ to the gate line forming area GLA, and then, the electroconductive ink is dropped by IJ to the gate electrode forming area GTA, and the electroconductive ink on the gate electrode GT can be poured and moved to the lyophilic area FA. In this case, a part of the gate electrode GT is superimposed on a part of the gate line GL.

As described above, when only the gate electrode forming area GTA of the thin-film transistor substrate is selectively exposed to light by the scanning using DMD, even a portion required of a large-size liquid crystal display panel can be turned to lyophilic within short time, and this contributes to extensive reduction of the cost in the manufacture of the liquid crystal display panel.

Embodiment 4

FIG. 10 and FIG. 11 each represents a schematical drawing to explain Embodiment 4 of the liquid crystal display panel manufacturing method according to the present invention. In Embodiment 4, as shown in FIG. 10, optical catalyst is coated by IJ on and around the gate electrode forming area GTA and the gate line forming area GLA of the thin-film transistor substrate SUB1. Then, by optical scanning using digital micro-mirror device (DMD), lyophilic property FA is provided to the gate electrode forming area GTA. The portions except the gate electrode forming area GTA, i.e. all portions including the gate line forming area remain to be lyophobic RA.

Next, as shown in FIG. 11, the electroconductive ink is dropped on the gate electrode forming area GTA by IJ, and the electroconductive ink of the gate electrode GT is poured to the lyophilic area FA. Then, the electroconductive ink is coated on the gate line forming area GLA by direct drawing of IJ. After the baking, the gate electrode GT and the gate line GL are prepared. When the electroconductive ink is coated on the gate line forming area GLA by direct drawing of IJ, the coated electroconductive ink is connected to the gate electrode GT by its driving force. FIG. 11 shows a process when the ink film of the gate line GL is poured by direct drawing from the right to the left in the figure.

In this case where these areas are formed by the procedure as described above, a part of the gate line GL is superimposed on a part of the gate electrode GT. It may also be arranged in such manner that the electroconductive ink is first coated on the gate line forming area GLA by direct drawing of IJ, and the electroconductive ink is dropped to the gate electrode forming area GTA by IJ so that the electroconductive ink of the gate electrode GT can be moved and poured to the lyophilic area FA. In this case, a part of the gate electrode GT is superimposed on a part of the gate line GL.

As described above, in this embodiment, too, optical catalyst is coated by IJ near the gate electrode forming area GTA of the thin-film transistor substrate, and the gate electrode forming area GTA is selectively exposed to light by the scanning using DMD. As a result, the coating time and the coating amount of the optical catalyst can be reduced. Also, even for a large-size liquid crystal display panel, the process to turn necessary area to lyophilic property can be carried out within short time, and this contributes to extensive cost reduction in the manufacture of the liquid crystal display panel.

In Embodiments 3 and 4 as given above, description has been given that IJ is used for the coating of the optical catalyst, while the present invention is not limited to this, and other methods such as spin coating or screen printing can be used.

Figure 12A:
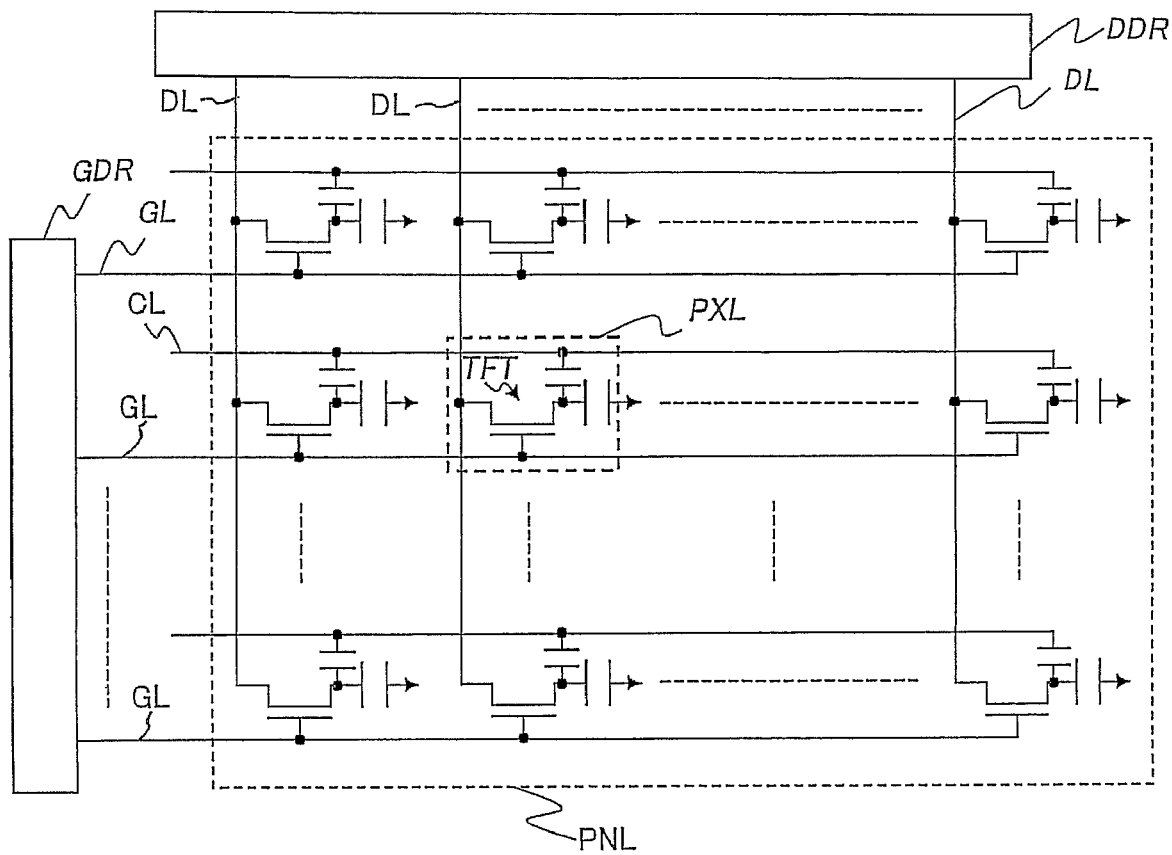
FIG. 12 represents diagrams to explain an equivalent circuit of an active matrix type liquid crystal display system.
Figure 12B:
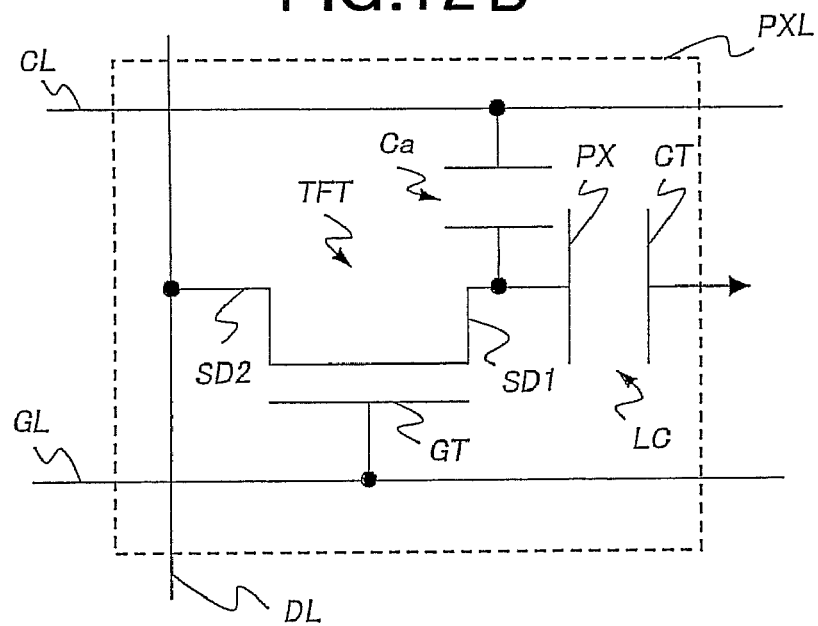

FIG. 12 represents diagrams to explain an equivalent circuit of an active matrix type liquid crystal display system. FIG. 12 (a) is a circuit diagram of the entire liquid crystal display panel, and FIG. 12 (b) is an enlarged view of a pixel portion PXL in FIG. 12 (a). In FIG. 12 (a), a multiple of pixel portions PXLs are arranged in matrix form. Each of the pixel portions PXLs can be selected by a gate line driving circuit GDR, and it is turned on (lighted up) according to a display data signal from the data line (also called "source line") driving circuit DDR.

Specifically, to correspond to the gate line GL selected by the gate line driving circuit GDR, display data (voltage) is supplied to the thin-film transistor TFT at the pixel portion PXL of the liquid crystal display panel PNL via the data line DL from the data line driving circuit DDR.

As shown in FIG. 11 (b), the thin-film transistor TFT to make up the pixel portion PXL is provided at the intersection of the gate line GL and the data line DL. The gate electrode GT of the thin-film transistor TFT is connected to the gate line GL, and the data line DL is connected to a drain electrode or a source electrode (a drain electrode in this case) SD2 of the thin-film transistor TFT.

A drain electrode or a source electrode (a source electrode in this case) SD1 of the thin-film transistor TFT is connected to a pixel electrode PX of a liquid crystal (element) LC. The liquid crystal LC is positioned between a pixel electrode PX and a common electrode CT, and it is driven by the data (voltage) supplied to the pixel electrode PX. An auxiliary capacity Ca for temporarily maintaining the data is connected between the drain electrode SD2 and an auxiliary capacity line CL.

In Embodiments 3 and 4, it is desirable that the electrode width of the gate electrode GT is designed to be different from the line width of the gate line GL so that the film thickness will be equal with each other. More concretely, the electrode width of the gate electrode GT is designed to be narrower than the line width of the gate line GL.

Figure 13:
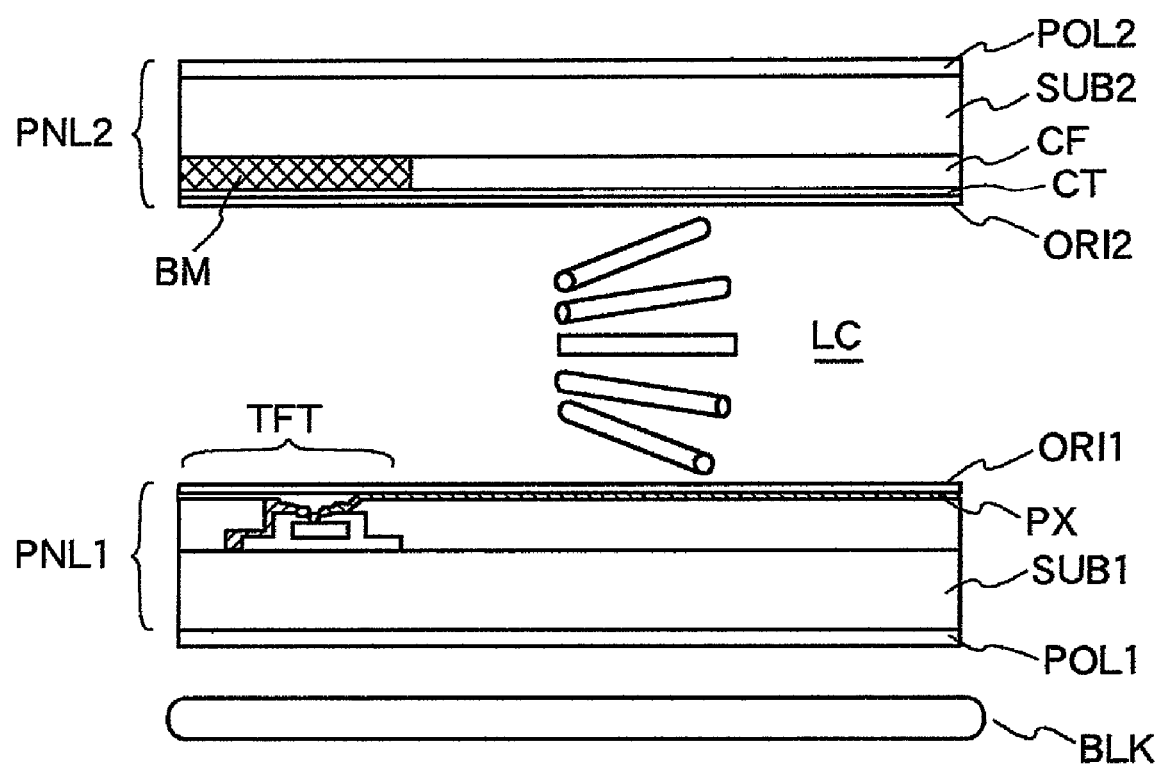
FIG. 13 is a schematical cross-sectional view to explain approximate arrangement of a typical longitudinal electric field type (the so-called TN type) liquid crystal display system.
Figure 14A:
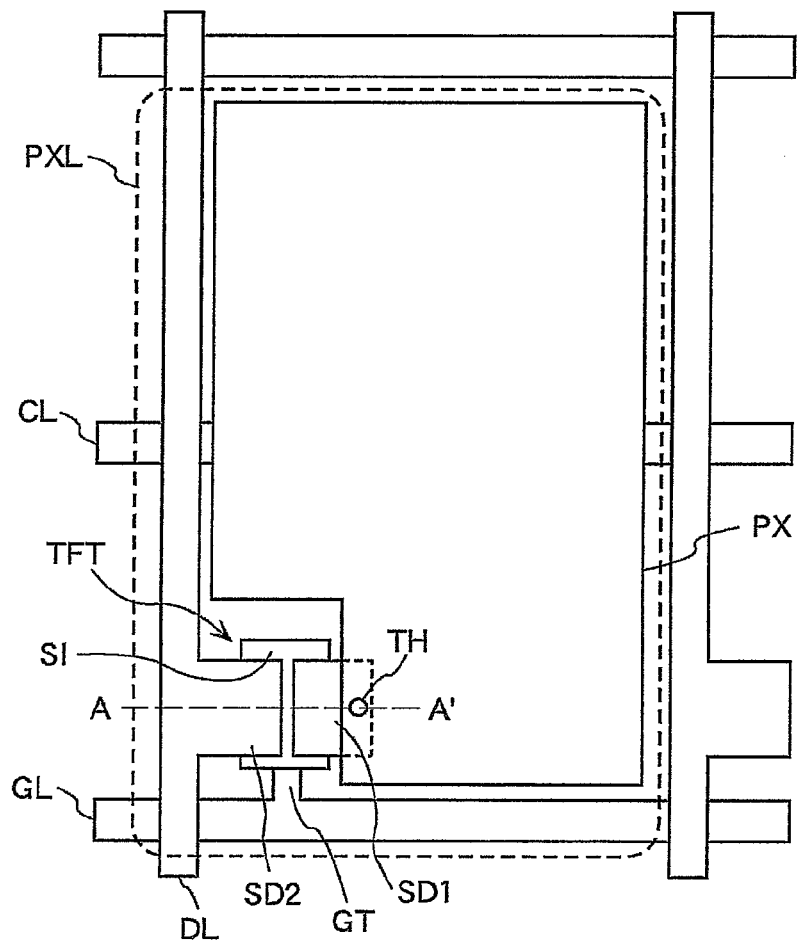
FIG. 14 represents drawings to explain an arrangement of one pixel of the liquid crystal display panel explained in connection with FIG. 13 and an arrangement of a thin-film transistor to make up this pixel.
Figure 14B:
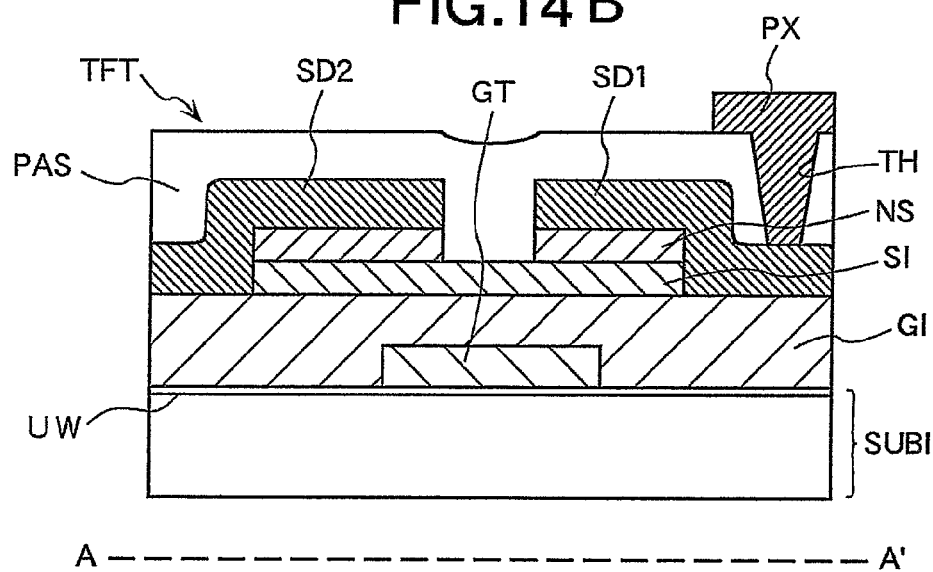

A liquid crystal display panel according to the present invention comprises the gate line GL and the gate electrode GT of FIG. 13 manufactured by the Embodiments of the present invention.

The present invention con be applied not only to the gate electrode of the thin-film transistor in the liquid crystal display panel but to the other lines and electrodes or various patterns of each constituting layer and also to the lines and the electrodes of various types of semiconductor systems to be formed on silicon substrate.

The invention claimed is:

1. A method for manufacturing a liquid crystal display panel, comprising a liquid crystal between a first substrate and a second substrate, and pixels with thin-film transistor arranged in form of matrix on said first insulation substrate, said method comprises:

a process for performing lyophobic-lyophilic processing by turning most of the surface of said first substrate where said thin-film transistor is formed to lyophobic property including a portion where electroconductive film with wide width is formed by direct drawing of electroconductive ink and by turning the surface to lyophilic property including a portion to form an electroconductive film with narrow width where the electroconductive ink cannot be applied by direct drawing;

a process for forming an ink film on the electroconductive portion with narrow width for obtaining an ink film to prepare the electroconductive film with narrow width with a film thickness as required by dropping an electroconductive ink to a portion where said electroconductive film with narrow width is formed, and by pouring the electroconductive ink of lyophilic property to a portion where the electroconductive film with narrow width is formed;

a process for forming an ink film on an electroconductive portion with wide width to obtain an ink film for forming an electroconductive film of wide width with film thickness as required by dropping an electroconductive ink to a portion where the electroconductive film of wide width is formed by direct drawing; and a process for baking an ink film to prepare the electroconductive film with narrow width and the electroconductive film with wide width by baking of said electroconductive ink film with narrow width and said electroconductive ink film with wide width;

wherein said processes are carried out in the order described herein.

2. A method for manufacturing a liquid crystal display panel according to claim 1, wherein, in the process for forming said electroconductive ink film with wide width by direct drawing of said electroconductive ink, a part of said electroconductive ink is superimposed on a part of said electroconductive ink with narrow width so that said electroconductive film with narrow width and said electroconductive film with wide width is turned to an integrated electroconductive film in said ink film baking process.

3. A method for manufacturing a liquid crystal display panel according to claim 1, wherein, in the process for forming said electroconductive ink film with wide width by direct drawing of said electroconductive ink, an electroconductive film with film thickness equal to film thickness of said electroconductive film with narrow width obtained in said ink film baking process by controlling a coating amount of said electroconductive ink.

4. A method for manufacturing a liquid crystal display panel according to claim 1, wherein, in said process of lyophobic-lyophilic processing, a base material with lyophobic property and to be turned to lyophilic by light projection is used on the surface of said first substrate, and light is projected to a portion, where said electroconductive film with narrow width is formed, to turn to lyophilic property.

5. A method for manufacturing a liquid crystal display panel according to claim 2, wherein said electroconductive film with wide width is a gate line of said thin-film transistor, and said electroconductive film with narrow width is a gate electrode.

6. A method for manufacturing a liquid crystal display panel, comprising a liquid crystal between a first substrate and a second substrate, and pixels with thin-film transistor arranged in form of matrix on said first insulation substrate, said method comprises:

a process for performing lyophobic-lyophilic processing by turning most of the surface of said first substrate where said thin-film transistor is formed to lyophobic property including a portion where electroconductive film with wide width is formed by direct drawing of electroconductive ink and by turning the surface to lyophilic property including a portion to form an electroconductive film with narrow width where the electroconductive ink cannot be applied by direct drawing;

a process for forming an ink film on an electroconductive portion with wide width to obtain an ink film for forming an electroconductive film of wide width with film thickness as required by dropping an electroconductive ink to a portion where the electroconductive film of wide width is formed by direct drawing;

a process for forming an ink film on the electroconductive portion with narrow width for obtaining an ink film to prepare the electroconductive film with narrow width with a film thickness as required by dropping an electroconductive ink to a portion where said electroconductive film with narrow width is formed, and by pouring the electroconductive ink of lyophilic property to a portion where the electroconductive film with narrow width is formed; and a process for baking an ink film to prepare the electroconductive film with narrow width and the electroconductive film with wide width by baking of said electroconductive ink film with narrow width and said electroconductive ink film with wide width;

wherein said processes are carried out in the order described herein.

7. A method for manufacturing a liquid crystal display panel according to claim 6, wherein, in the process for forming said electroconductive ink film with wide width by direct drawing of said electroconductive ink, a part of said electroconductive ink is superimposed on a part of said electroconductive ink with narrow width so that said electroconductive film with narrow width and said electroconductive film with wide width is turned to an integrated electroconductive film in said ink film baking process.

8. A method for manufacturing a liquid crystal display panel according to claim 6, wherein, in the process for forming said electroconductive ink film with wide width by direct drawing of said electroconductive ink, an electroconductive film with film thickness equal to film thickness of said electroconductive film with narrow width obtained in said ink film baking process by controlling a coating amount of said electroconductive ink.

9. A method for manufacturing a liquid crystal display panel according to claim 6, wherein, in said process of lyophobic-lyophilic processing, a base material with lyophobic property and to be turned to lyophilic by light projection is used on the surface of said first substrate, and light is projected to a portion, where said electroconductive film with narrow width is formed, to turn to lyophilic property.

10. A method for manufacturing a liquid crystal display panel according to claim 7, wherein said electroconductive film with wide width is a gate line of said thin-film transistor, and said electroconductive film with narrow width is a gate electrode.

11. A method for manufacturing a liquid crystal display panel comprising a liquid crystal between a first substrate and a second substrate, and pixels with thin-film transistors in the form of a matrix on said first substrate, said method comprising:

performing lyophobic-lyophilic processing by turning most of a surface of said first substrate where said thin-film transistors is formed to a lyophobic property including a portion where as electroconductive film with a wide width is formed by direct drawing of an electroconductive ink, and by turning the surface to a lyophilic property including a portion to form an electroconductive film with a narrow width where the electroconductive ink cannot be applied by direct drawing;

forming an ink file on an electroconductive portion with a wide width by dropping an electroconductive ink to a portion where the electroconductive film of the wide width is formed by direct drawing;

forming an ink film on the electroconductive portion with a narrow width by dropping an electroconductive ink to a portion where the electroconductive film with the narrow width is formed; and baking the ink film to prepare an electroconductive film with a narrow width and an electroconductive film with a wide width.

12. A method for manufacturing a liquid crystal display panel according to claim 11, wherein, when the electroconductive film with the wide width is formed by direct drawing of said electroconductive ink, a part of said electroconductive ink is superimposed on a part of said electroconductive ink with the narrow width so that the electroconductive film with the narrow width and the electroconductive film with the wide width is turned to an integrated electroconductive film in the ink film baking process.

13. A method for manufacturing a liquid crystal display panel according t claim 11, wherein when the electroconductive film with the wide width is formed by direct drawing of said electroconductive ink, an electroconductive film with a film thickness equal to a film thickness of the electroconductive film with the narrow width obtained in the ink film baking process by controlling a coating amount of said electroconductive ink.

14. A method for manufacturing a liquid crystal display panel according to claim 11, wherein, during the lyophobic-lyophilic processing, a base material with lyophobic property and to be turned to lyophilic by light projection is used on the surface of said first substrate, and light is projected to a portion, where the electroconductive film with the narrow width is formed, to turn to lyophilic property.

15. A method for manufacturing a liquid crystal display panel according to claim 11, wherein the electroconductive film with the wide width is a gate line of said thin-film transistors, and the electroconductive film with the narrow width is a gate electrode of said thin-film transistors.

* * * * *